United States Patent
Qin et al.

(10) Patent No.: US 10,153,357 B1
(45) Date of Patent: Dec. 11, 2018

(54) SUPERJUNCTION POWER SEMICONDUCTOR DEVICE AND METHOD FOR FORMING

(71) Applicant: NXP USA, INC., Austin, TX (US)

(72) Inventors: Ganming Qin, Chandler, AZ (US); Vishnu Khemka, Chandler, AZ (US); Tanuj Saxena, Tempe, AZ (US); Moaniss Zitouni, Gilbert, AZ (US); Raghuveer Vankayala Gupta, Austin, TX (US); Mark Edward Gibson, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/687,881

(22) Filed: Aug. 28, 2017

(51) Int. Cl.
H01L 29/66 (2006.01)
H01L 29/40 (2006.01)
H01L 29/78 (2006.01)
H01L 29/06 (2006.01)

(52) U.S. Cl.
CPC .... H01L 29/66734 (2013.01); H01L 29/0634 (2013.01); H01L 29/401 (2013.01); H01L 29/404 (2013.01); H01L 29/407 (2013.01); H01L 29/66704 (2013.01); H01L 29/7813 (2013.01); H01L 29/7825 (2013.01)

(58) Field of Classification Search
CPC . H01L 29/407; H01L 29/0634; H01L 29/404; H01L 29/66734; H01L 29/66704; H01L 29/7825; H01L 29/7813
See application file for complete search history.

(56) References Cited

U.S. PATENT DOCUMENTS

| | | |
|---|---|---|
| 7,319,256 B1 | 1/2008 | Kraft et al. |
| 7,385,248 B2 | 6/2008 | Herrick et al. |
| 2006/0214221 A1 | 9/2006 | Challa et al. |
| 2007/0155104 A1* | 7/2007 | Marchant ............ H01L 29/407 438/270 |
| 2016/0247916 A1* | 8/2016 | Stefanov ............ H01L 27/088 |
| 2016/0260814 A1* | 9/2016 | Yilmaz ............ H01L 29/66666 |

* cited by examiner

*Primary Examiner* — Selim Ahmed
*Assistant Examiner* — Evan Clinton

(57) ABSTRACT

A method for manufacturing a super junction power MOSFET includes forming a first trench in a substrate, forming a first oxide layer over the substrate and in the bottom and along sidewalls of the trench, depositing electrically conductive material in the trench, masking a first portion of the electrically conductive material, forming a recessed portion of the electrically conductive material, forming an oxide portion over and in contact with the recessed portion of the electrically conductive material, removing a part of the oxide portion by masking, removing the first oxide layer on the sidewalls while another part of the oxide portion remains in contact with the recessed portion of the electrically conductive material, forming a gate dielectric along exposed sidewalls of the trench, and depositing additional electrically conductive material over the other part of the oxide portion in the trench.

19 Claims, 9 Drawing Sheets

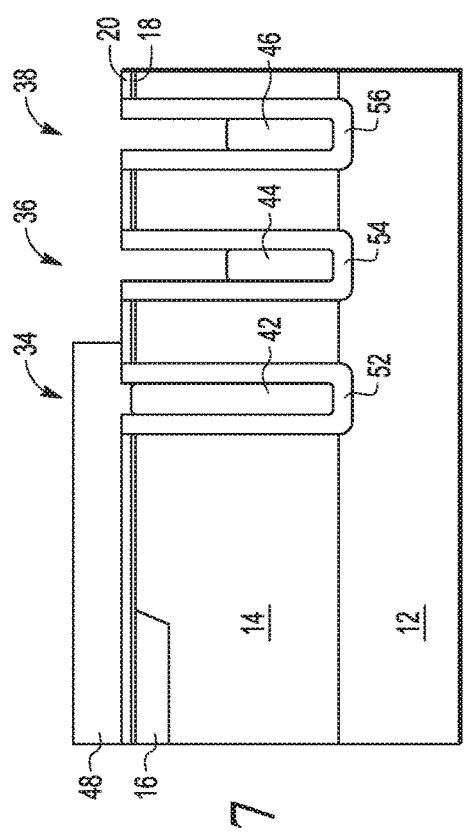
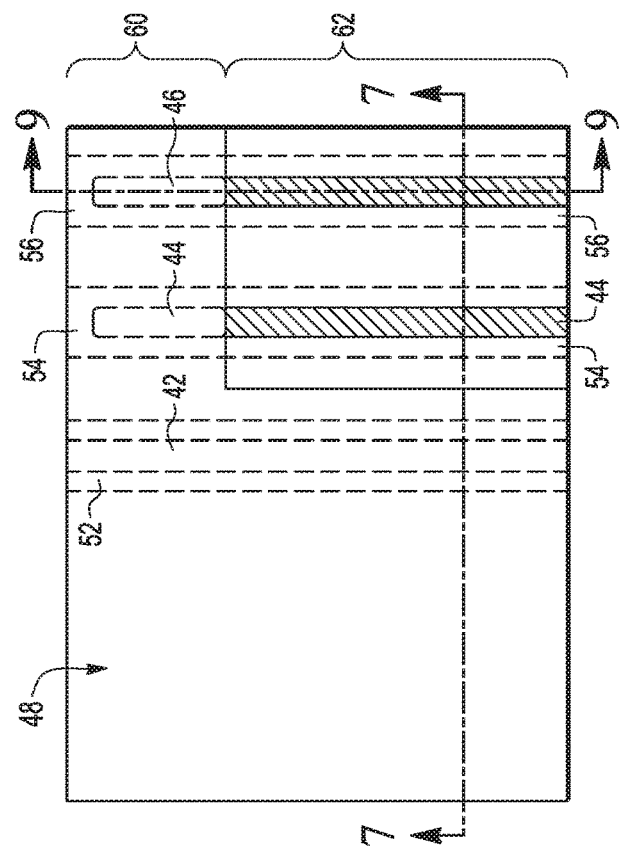
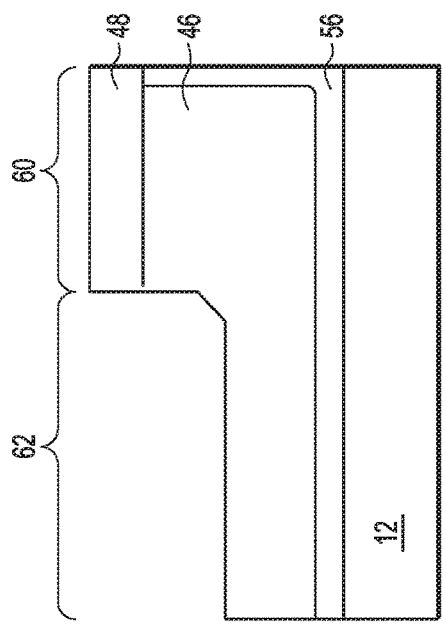
FIG. 7
FIG. 8
FIG. 9

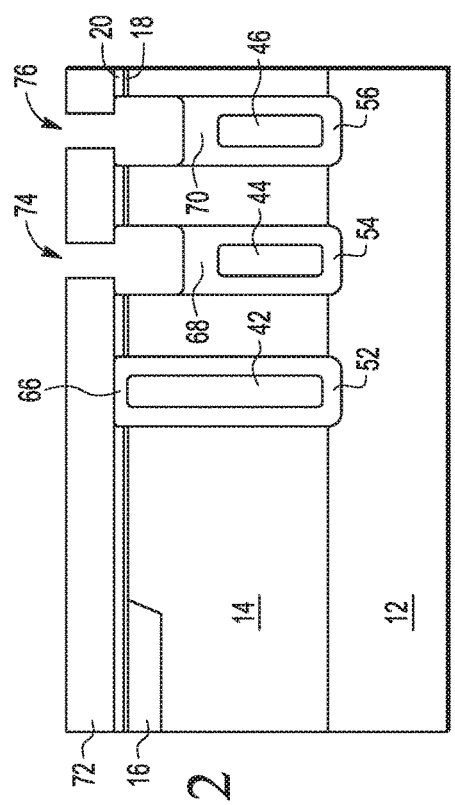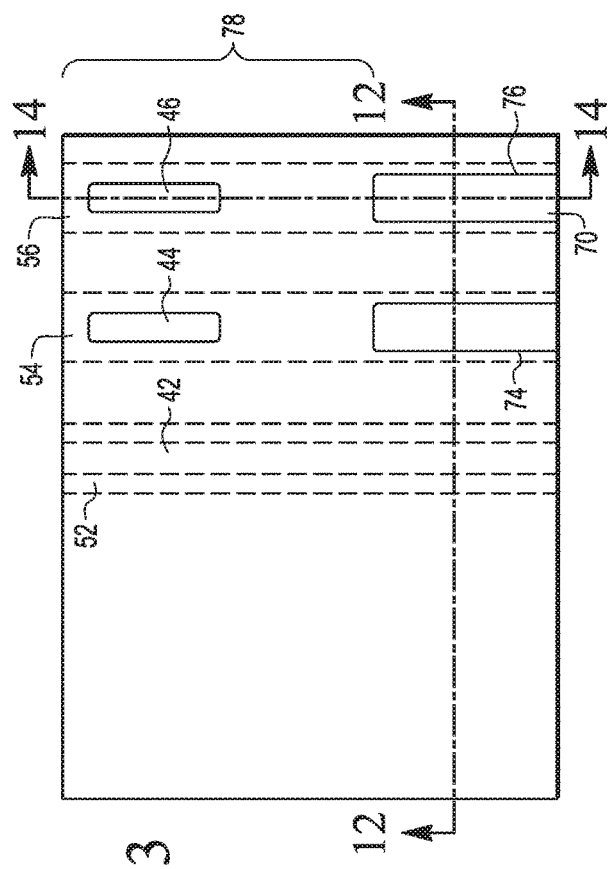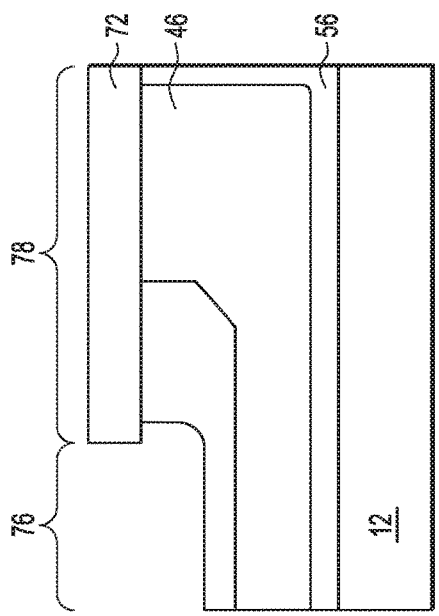

SUPERJUNCTION POWER SEMICONDUCTOR DEVICE AND METHOD FOR FORMING

BACKGROUND

Field

This disclosure relates generally to semiconductor processing, and more specifically, to a superjunction power semiconductor device and method for forming.

Related Art

Power devices based on superjunction technology are commonly used in high-voltage switching applications. Superjunction power devices includes trenches which extend into the body, each including both a polysilicon gate electrode and a polysilicon shield electrode. The gate and shield electrodes are insulated from each other by an interpoly dielectric (IPD). However, with current processes, the oxide to form the IPD and the gate oxide are grown at the same time, with the IPD oxide being slightly thicker. As a result, sharp corners are formed in the bottom corners of the gate poly and in the top corners of the shield electrode. These sharp corners result in high electrical field, thus high leakage and low breakdown of the IPD. This degrades performance and long-term reliability of the power device. Therefore, a need exists for a superjunction power device with an improved IPD.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 1-7 illustrate cross-sections at a first cut of a superjunction power semiconductor device at various stages in processing, in accordance with embodiments of the present invention.

FIG. 8 illustrates a top-down view of the device of FIG. 7, in accordance with one embodiment of the present invention.

FIG. 9 illustrates a cross-section of the device of FIG. 7 at a second cut, in accordance with one embodiment of the present invention.

FIGS. 10-12 illustrate cross-sections at the first cut of the device of FIG. 7 at various subsequent stages in processing, in accordance with embodiments of the present invention.

FIG. 13 illustrates a top-down view of the device of FIG. 12, in accordance with one embodiment of the present invention.

FIG. 14 illustrates a cross-section of the device of FIG. 12 at the second cut, in accordance with one embodiment of the present invention.

DETAILED DESCRIPTION

In one aspect, an improved IPD is formed which reduces or eliminates the formation of sharp corners in the bottom corners of the gate electrodes and in the top corners of the shield electrodes of a superjunction power semiconductor device. In forming a superjunction power semiconductor device, trenches are formed in a semiconductor layer, in which the trenches are filled with polysilicon. A masking layer protects a first trench and an end portion of the other trenches while the polysilicon is recessed within the unprotected trenches to result in the shield electrodes. The trenches are then filled with an oxide over the shield electrodes. Subsequently, openings are formed in the oxide for the formation of gate electrodes. In each trench, the oxide located between the gate electrode and the shield electrode corresponds to the IPD. Due to this method of formation, though, the occurrence of sharp corners is reduced or prevented. This results in improved performance and long-term reliability of the superjunction power device.

Figure 1:
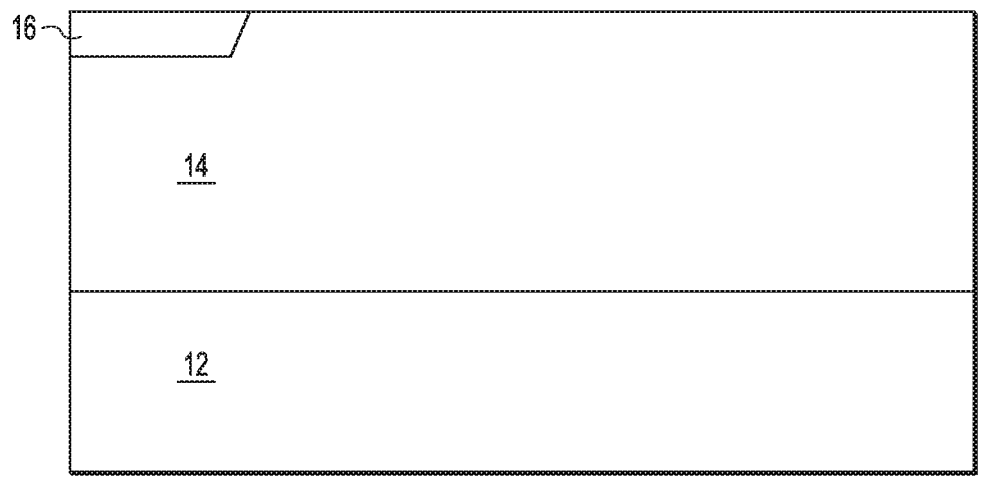

FIG. 1 illustrates, in cross-section form, a superjunction power semiconductor device 10 at a first stage in processing, in accordance with one embodiment of the present invention. Device 10 may also be referred to as a superjunction power metal oxide semiconductor field effect transistor (MOSFET). Device 10 includes a semiconductor substrate 12 and a semiconductor layer 14 over substrate 12. In one embodiment, substrate 12 is a silicon substrate, and may be heavily doped N-type ($N_{++}$) substrate, and semiconductor layer 14 is an N-type epitaxial silicon layer. In alternate embodiments, semiconductor substrate 12 can include any semiconductor material or combinations of materials, such as gallium arsenide, silicon germanium, silicon, monocrystalline silicon, the like, and combinations of the above. A shallow trench isolation (STI) region 16 is formed in the top of semiconductor layer 14 and extends partially into layer 14.

Figure 2:
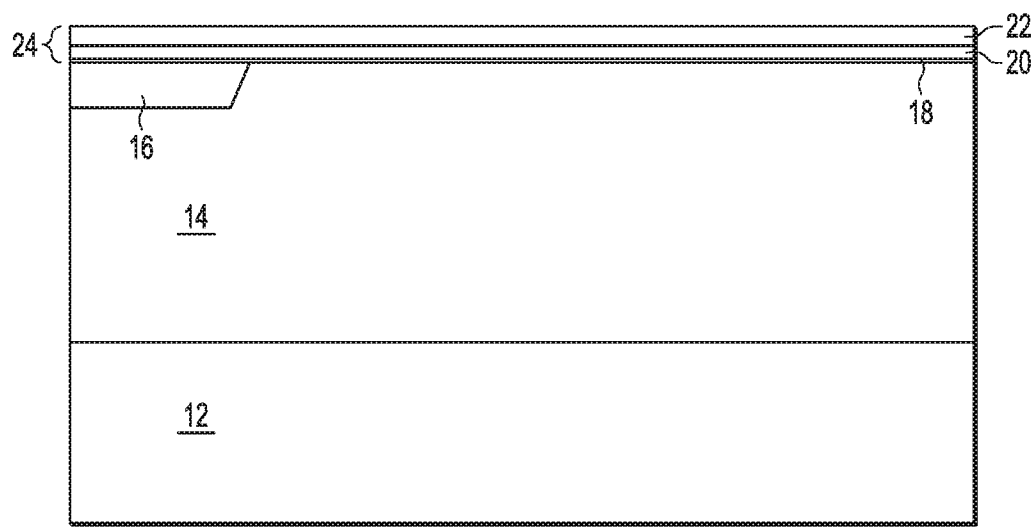

FIG. 2 illustrates device 10 of FIG. 1 at a subsequent stage in processing in accordance with an embodiment of the present invention in which a hard mask 24 is formed over layer 14 (formed over a major surface of layer 14). To form hard mask layer 24, an oxide layer 18 is grown on semiconductor layer 14, a nitride layer 20 is formed over oxide layer 18, and an oxide layer 22 is formed over nitride layer 20. In alternate embodiments, hard mask layer 24 can be formed using more or fewer layers, or different materials.

Figure 3:
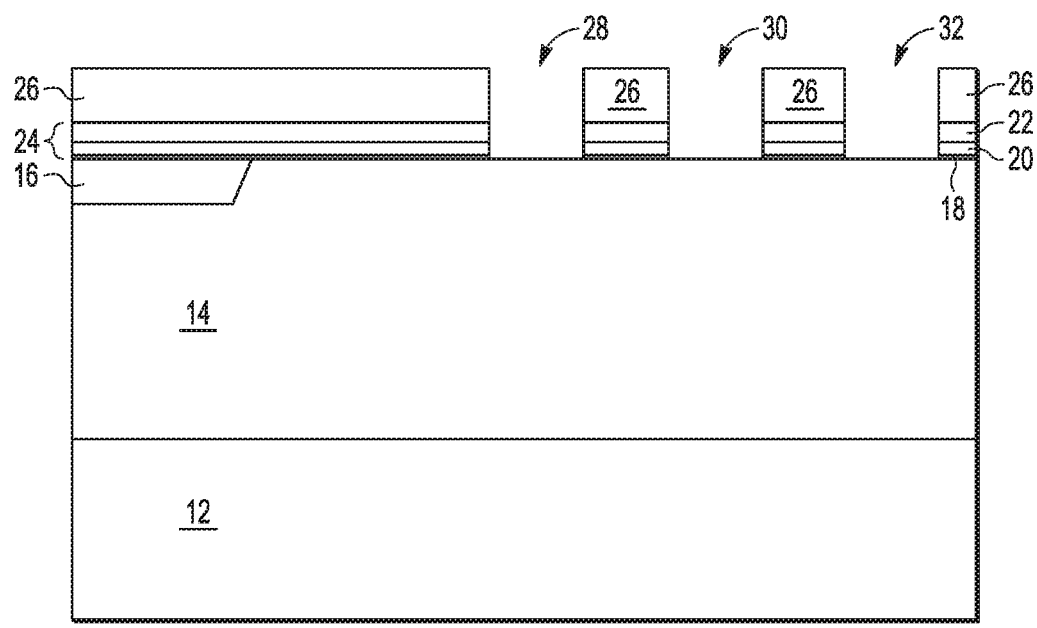

FIG. 3 illustrates device 10 of FIG. 2 at a subsequent stage in processing in accordance with an embodiment of the present invention in which a patterned photoresist layer 26 is formed over hardmask layer 24 to define openings. An etch is performed using patterned photo resist 26 to form openings 28, 30, and 32 through hard mask layer 24. Afterwards, photoresists layer 26 is removed.

Figure 4:
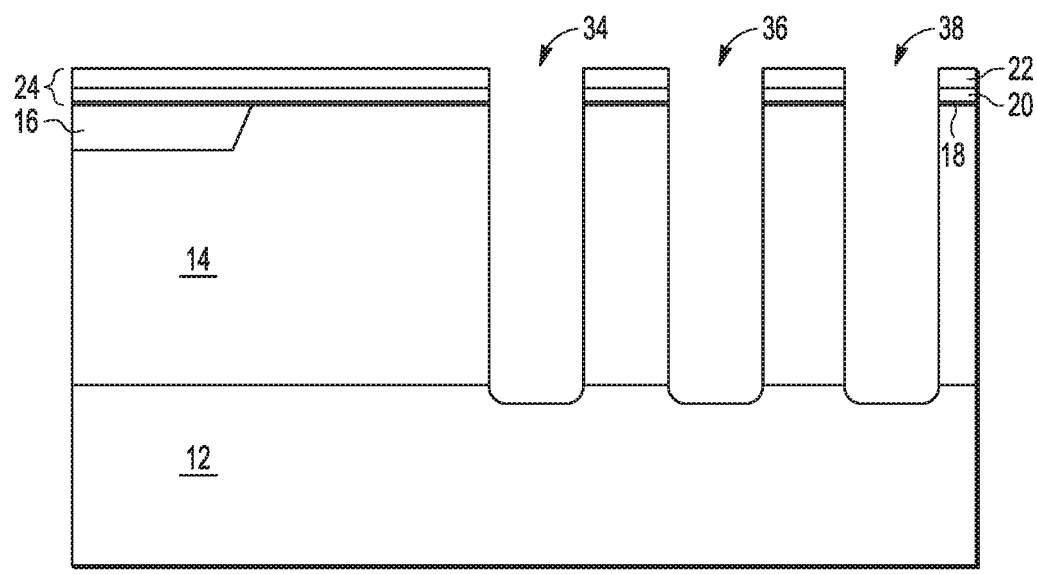

FIG. 4 illustrates device 10 of FIG. 3 at a subsequent stage in processing in accordance with an embodiment of the present invention in which an etch extends openings 28, 30, and 32 into semiconductor layer 14 to form trenches 34, 36, and 38, respectively. Each of trenches 34, 36, and 38 extends into layer 14 above substrate 12 or extends into substrate 12. Any number of trenches may be formed although only 3 are shown in the illustrated embodiment. Each trench also extends into and out of the page, as will be seen in the top-down view of FIG. 8 described below, and are parallel as they extend into and out of the page.

Figure 5:
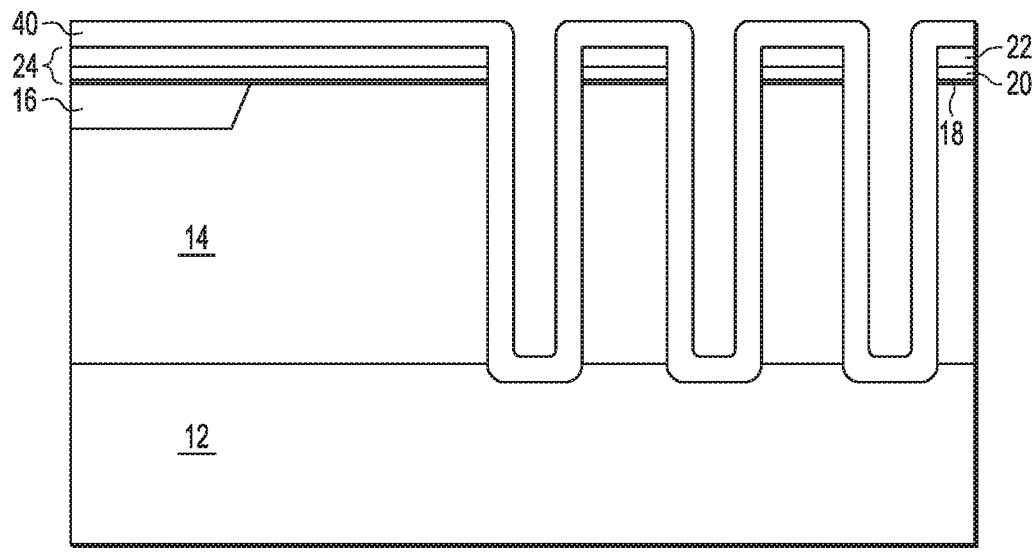

FIG. 5 illustrates device 10 of FIG. 4 at a subsequent stage in processing in accordance with an embodiment of the present invention in which an oxide layer 40 is formed over hardmask layer 24 and within trenches 34, 36, and 38. Oxide layer 40 may be blanket deposited over the hardmask and within the trenches.

Figure 6:
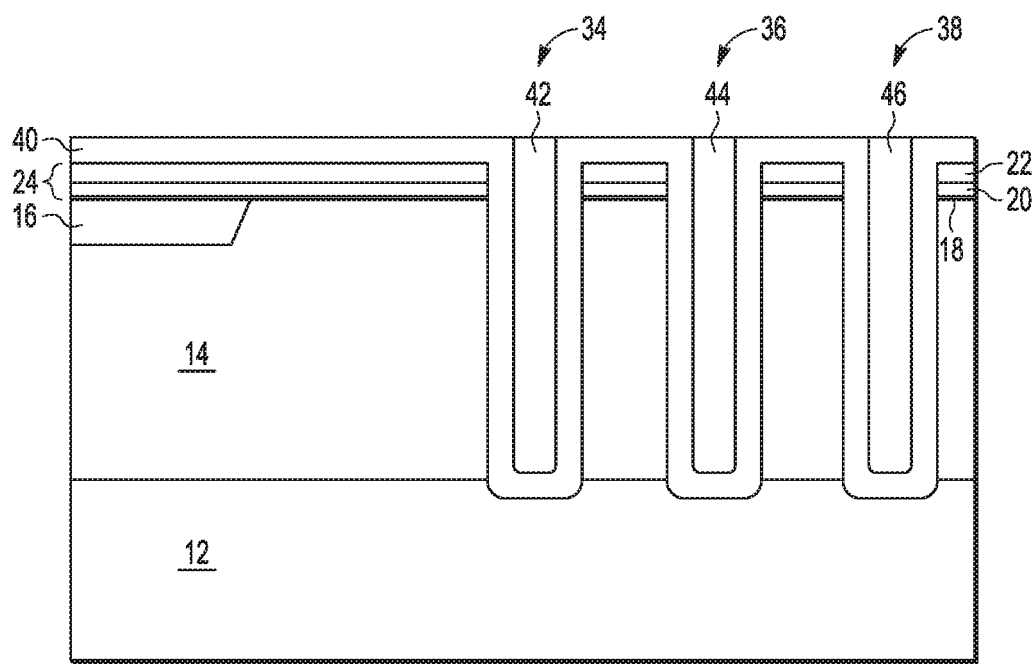

FIG. 6 illustrates device 10 of FIG. 5 at a subsequent stage in processing in accordance with an embodiment of the present invention in which trenches 34, 36, and 38 are filled with polysilicon to form shield electrodes 42, 44, and 46, respectively. Therefore, in each trench, there is an oxide layer lining the trench and a polysilicon fill. In one embodiment, a layer of polysilicon is deposited over the trenches to fill the trenches and then a chemical-mechanical polishing (CMP) is performed to remove material which extends above nitride layer 20, including oxide layer 22 and portions of oxide layer 40.

FIG. 7 illustrates device 10 of FIG. 6 at a subsequent stage in processing in accordance with an embodiment of the present invention. A patterned photo resist layer 48 is formed over oxide layer 40 and covers trench 34 and exposes the remaining trenches, such as trenches 36 and 38. Therefore, resist layer 48 protects shield electrode 42 while exposing electrodes 44 and 46 (and other electrode located further to the right of electrodes 44 and 46 but which are not visible in the cross section of FIG. 7). An etch is performed using resist layer 48 to remove top portions of electrodes 44 and 46 while electrode 42 is protected from the etch. That is, only those electrodes not protected by resist layer 48 are recessed from a top surface of semiconductor layer 14. In one embodiment, as a result of the etch, 30-50% of the polysilicon material is removed from trenches not protected by layer 48. In one embodiment, 40% is removed.

FIG. 8 illustrates a top-down view of device 10 of FIG. 7 with resist layer 48. Resist layer 48 covers all of electrode 42 within trench 34 and exposes most of the other trenches, except for an end portion 60 of each trench. Note also that in forming the trenches, trench 34 extends all the way to the end through end portion 60, and trenches 36 and 38 do not extend all the way to the end of end portion 60. Therefore, a portion of oxide layers 54 and 56 in trenches 36 and 38 are located at the end of end portion 60 while trench 34 goes around the ends of layers 54 and 56 by a certain trench-to-trench spacing. For example, the spacing can be the same as the spacing between trenches 34 and 36. Note also that the end of trenches 54 and 56 can be of any shape, such as, for example, rectangular, circular, a corner chamfer, or any polygon. The exposed portion 62 of device 10 allows electrodes 44 and 46 to be recessed during the etch. Therefore, the hatch marks on each of electrode 44 and 46 in exposed portion 62 illustrate the recessed portions of the electrodes.

FIG. 9 illustrates a cross-section view of device 10 at the same processing stage as FIG. 7 taken through a different cross-section, perpendicular from that of FIG. 7. That is, FIG. 7 illustrates a cross-section view of device 10 through a first cut which traverses trench 34 and trenches 36 and 38 in exposed portion 62 along an x-direction of the page, and FIG. 9 illustrates a cross-section view of device 10 through a second cut which traverses only trench 38 along a y-direction of the page, perpendicular to the x-direction. In FIG. 9, the end portion 60 includes a portion of shield electrode 46, covered by resist layer 48, that is not recessed. Adjacent to the non-recessed portion of electrode 46 is located a portion of oxide layer 56. Exposed portion 62 includes a recessed portion of electrode 46.

Figure 10:
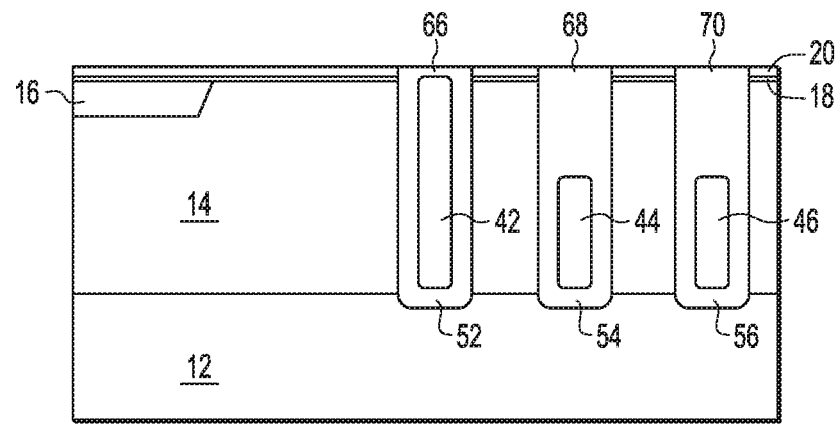

FIG. 10 illustrates device 10 of FIG. 7 at a subsequent stage in processing at the same cross-section location as FIG. 7 in accordance with an embodiment of the present invention. After electrodes 44 and 46 are recessed, an oxide fill is performed followed by a CMP to form oxide portions 68 and 70. Oxide portion 68 is formed within trench 36 and is located directly on top and in contact with recessed electrode 44, and oxide portion 70 is formed within trench 38 and is located directly on top and in contact with recessed electrode 46. In one embodiment, the oxide fill is formed using tetraethyl orthosilicate (TEOS). Due to the CMP, the tops of oxide portions 68 and 70 are coplanar with the top of nitride layer 20.

Figure 11:
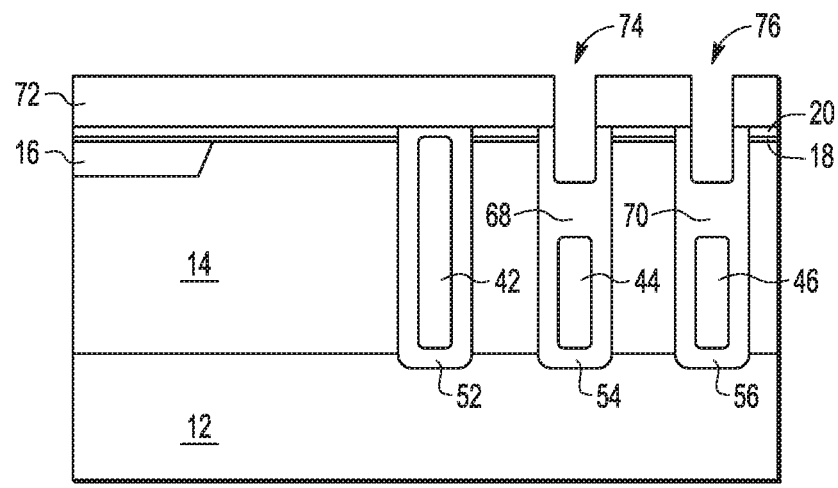

FIG. 11 illustrates device 10 of FIG. 10 at a subsequent stage in processing in accordance with an embodiment of the present invention. A patterned masking layer 72 is formed over device 10 having openings which are located in the centers of each trench 36 and 38, respectively. The openings in masking layer 72 overhang to cover and protect a portion of oxide layers 54 and 56 adjacent to semiconductor layer 14. An anisotropic etch is performed to form openings 74 and 76 in oxides portions 68 and 70, respectively. Openings 74 and 76 extend into oxide portions 68 and 70, but do not extend all the way to electrodes 44 and 46. That is, portions of oxides portions 68 and 70 remain covering electrodes 44 and 46. Also, portions of oxide layer 54 and 56 remain on sidewalls of trenches 36 and 38, extending to the top of the trenches.

FIG. 12 illustrates device 10 of FIG. 11 at a subsequent stage in processing in accordance with an embodiment of the present invention. Using patterned masking layer 74, an isotropic etch is performed to expand openings 74 and 76. Due to the isotropic etch, oxide portions 68 and 70 over electrodes 44 and 46 are further thinned and the oxides from the sidewalls of the trenches over oxide portions 68 and 70 are also removed. Note that sufficient oxide remains directly on electrodes 44 and 46 after the isotropic etch to protect electrodes 44 and 46.

FIG. 13 illustrates a top-down view of device 10 of FIG. 12 with patterned masking layer 72. Layer 72 covers all of electrode 42 within trench 34 and covers an end portion 78 of trenches 36 and 38. Openings 74 and 76 expose center portions of trenches 36 and 38, which expose oxide portions 68 and 70. Note that openings 74 and 76 do not extend the full length of trenches 36 and 38. That is, they do not extend into end portion 78, which includes portions of the shield electrodes which are not recessed and thus extend to the top surface of device 10, as was described above.

FIG. 14 illustrates a cross-section view of device 10 at the same processing stage as FIG. 12 but taken through a different cross-section, perpendicular from that of FIG. 12 (corresponding to the same location as the cross-section of FIG. 9). That is, FIG. 12 illustrates a cross-section view of device 10 through the first cut similar to FIG. 7, and FIG. 14 illustrates a cross-section view of device 10 through the second cut similar to FIG. 9. In FIG. 14, end portion 78 includes a portion of oxide portion 70 and shield electrode 46, both covered by layer 72, that are not recessed. Opening 76 includes a recessed portion of oxide portion 70.

Figure 15:
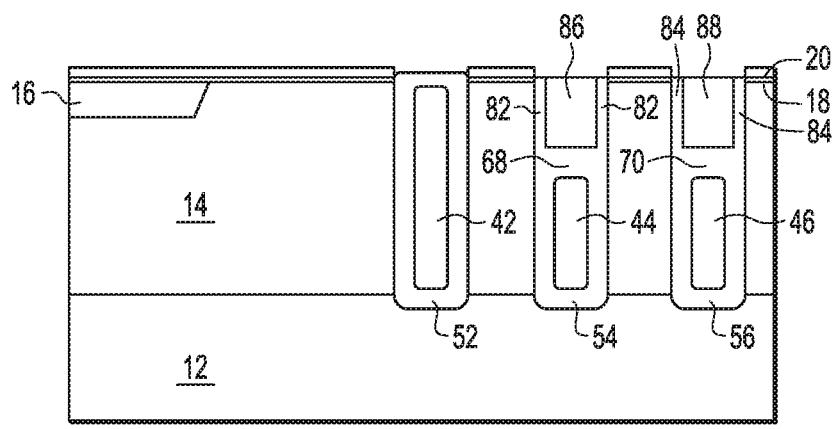
FIGS. 15-16 illustrate cross-sections at the first cut of the device of FIG. 12 at various subsequent stages in processing, in accordance with embodiments of the present invention.

FIG. 15 illustrates device 10 of FIG. 12 at a subsequent stage in processing at the same cross-section location as FIG. 12 in accordance with an embodiment of the present invention. Gate dielectrics 82 and 84 are formed along the sidewalls (e.g. silicon sidewalls) of trenches 36 and 38, respectively. In one embodiment, gate dielectrics 82 and 94 are formed by growing an oxide layer in the trenches. Trenches 36 and 38 are filled with polysilicon. In one embodiment, a polysilicon layer is deposited over device 10, filing the empty portions of trenches 36 and 38, and a CMP is performed to result in polysilicon gate electrodes 86 and 88, respectively, in which the top surface of gate electrodes 86 and 88 is at or below the top surface of semiconductor layer 14. In this manner, gate electrodes 86 and 88 are formed over shield electrodes 44 and 46, respectively, separated by an oxide, such as oxide portions 68 and 70.

Figure 16:
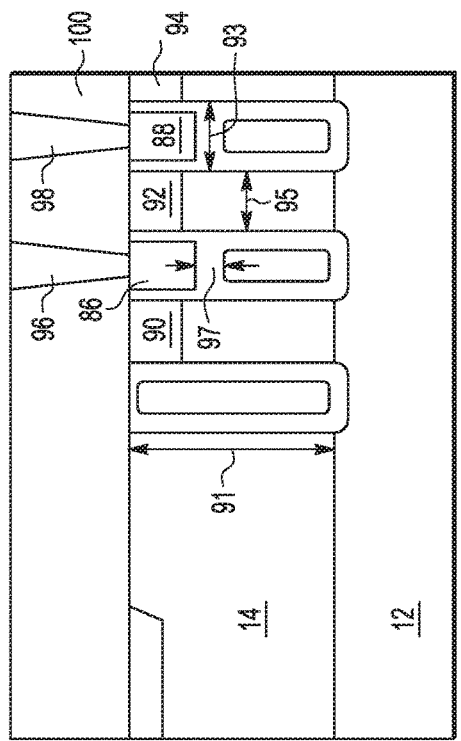

FIG. 16 illustrates device 10 of FIG. 15 at a subsequent stage in processing in accordance with an embodiment of the present invention. Nitride layer 20 is removed from the top surface of semiconductor layer 14. Body implants are performed into a top portion of semiconductor layer 14, resulting in an implant region 90 between trench 34 and trench 36, an implant region 92 between trenches 36 and 38, and an implant region 94 between trench 38 and a trench to the right of trench 38 (not visible in the cross section of FIG. 16). In one embodiment, the body implants are P-type implants. An interlevel dielectric (ILD) 100 is formed over semiconductor layer 14 and trenches 34, 36, and 38. In one embodiment, ILD 100 is formed by blanket depositing an oxide layer. Gate contacts 96 and 98 are formed in ILD 100 to contact gate electrodes 86 and 88, respectively.

In one embodiment, gate oxide layers 82 and 84 have a thickness in a range of 300 to 1500 Angstroms, such as, for example, 800 Angstroms. In one embodiment, the width of each trench, such as width 93 of trench 38, is in a range of 1 to 3 microns, such as, for example, 1.6 microns. The depth of each trench, such as depth 91 of trench 34, is in a range of 3 to 8 microns, such as, for example, 5.5 microns. In one embodiment, the semiconductor stripe width of semiconductor layer 14 between trenches, such as width 95, is in the range of 0.5 to 2 microns, such as, for example, 1.2 microns. In one embodiment the width of each oxide portion between a gate electrode and a corresponding shield electrode within a trench, such as thickness 97, is in a range of 0.1 to 0.5 microns, such as, for example, 0.2 microns. This oxide between the gate electrode and shield electrode is referred to as the inter poly dielectric (IPD). Also, different dielectrics, other than or in addition to oxide, for the gate dielectrics and the IPDs.

Figure 17:
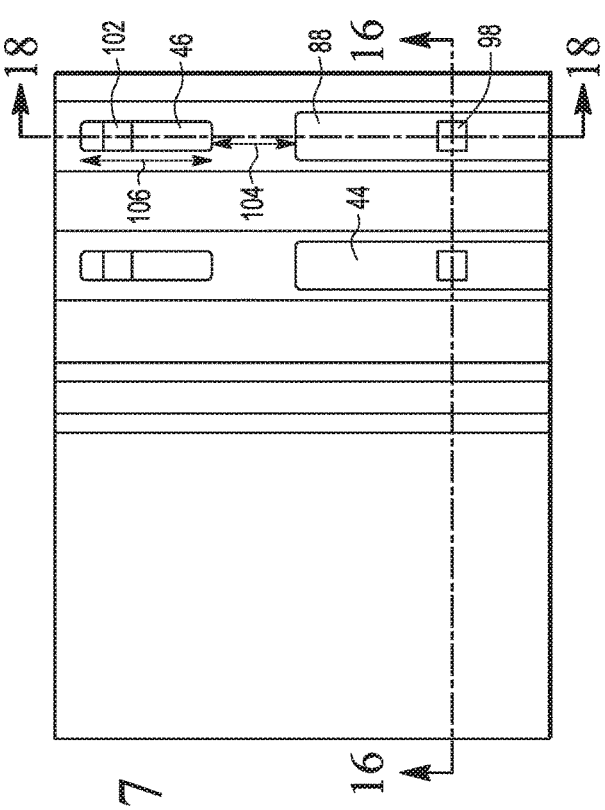
FIG. 17 illustrates a top-down view of the device of FIG. 16, in accordance with one embodiment of the present invention.

FIG. 17 illustrates a top-down view of device 10 of FIG. 16. In addition to forming contacts to the gate electrodes in ILD 100, contacts are also formed to shield electrodes in ILD 100. For example, contact 102 is formed to contact shield electrode 46. Contact 102 is formed in the end portion of device 10 to the unrecessed portion of shield electrode 46. The distance along the IPD between the unrecessed portion of the shield electrode and gate electrode is referred to as the IPD lateral distance. The IPD lateral distance, such as IPD lateral distance 104 between the unrecessed portion of shield electrode 46 and gate electrode 88, is in a range of 0.5 to 5 microns, such as, for example, 2 microns. The length of an unrecessed portion of the shield electrode, such as length 106 of the unrecessed portion of shield electrode 46, is in a range of 1-10 microns, such as, for example, 5 microns.

Figure 18:
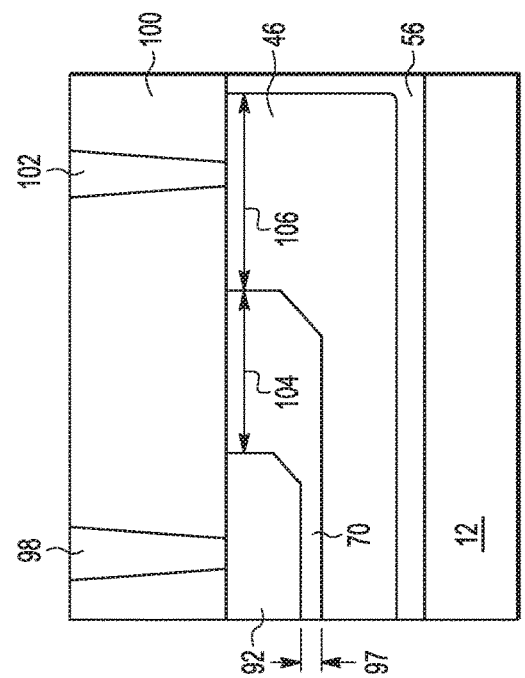
FIG. 18 illustrates a cross-section of the device of FIG. 16 at the second cut, in accordance with one embodiment of the present invention.

FIG. 18 illustrates a cross-section view of device 10 at the same processing stage as FIG. 16 but taken through the second cut similar to FIGS. 9 and 14. In FIG. 18, IPD lateral distance 104, length 106 of the unrecessed portion of shield electrode 46, and IPD thickness 97 are indicated.

Figure 19:
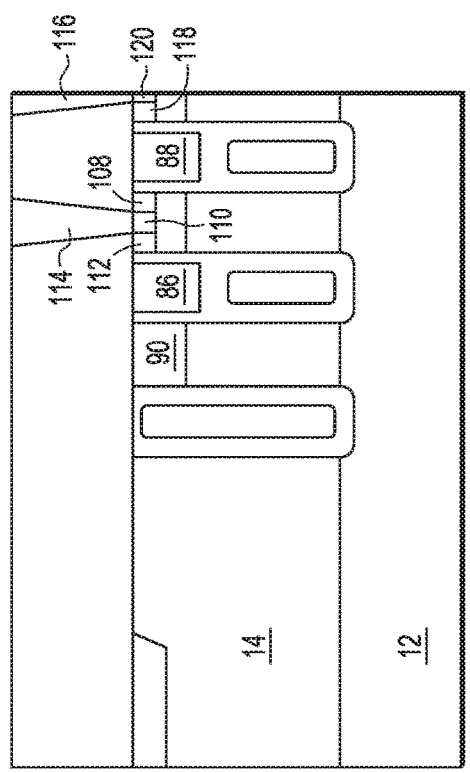
FIG. 19 illustrates a cross-section of the device of FIG. 16 at a third cut, in accordance with one embodiment of the present invention.

FIG. 19 illustrates device 10 of FIG. 16 at a subsequent stage in processing in accordance with an embodiment of the present invention. The cross-section of FIG. 19 is taken at a third cut along the x-direction, parallel to the first cut and further down from the first cut. Source/body contacts, such as source/body contacts 114 and 116, are formed in ILD 100, contacting semiconductor layer 14 between the trenches, such as between trenches 36 and 38. N+ and P+ implants are performed to form heavily doped N+ and P+ regions within implant regions 92 and 94. P+ region 110 is formed in implant region 92 under and in contact with contact 114, and N+ regions 112 and 108 are formed on either side of P+ region 110 in implant region 92 and they also contact source/body contact 114. Therefore, P+ region 110 provides a body contact for device 10, and regions 112 and 108 provide source contacts for device 10. Similar P+ and N+ regions are formed in implant region 94, under and in contact with source/body contact 116. The P+ and N+ regions are formed in implant regions 92 and 94, but do not extend to the bottom of implant regions 92 and 94. In this manner, source/body contacts 114 and 116 provide contacts to both the source and body of device 10.

Figure 20:
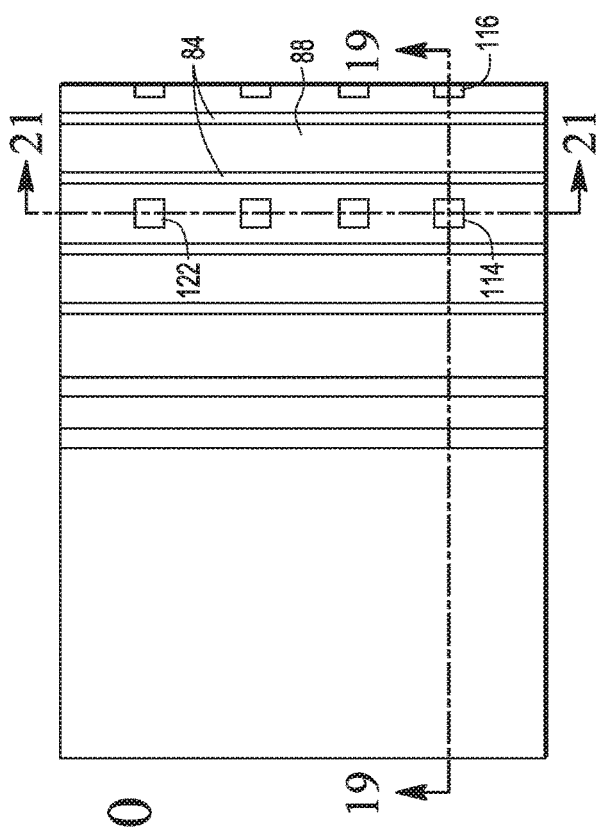
FIG. 20 illustrates a top down view of the device of FIG. 19, in accordance with one embodiment of the present invention.

FIG. 20 illustrates a top down view of device 10 at the processing stage of FIG. 19. Note that any number of source/body contacts can be placed between the trenches, along the strips of semiconductor layer 14. For example, any number can be formed between trenches 36 and 38 (such as source/body contacts 114 and 122), and between trench 38 and a trench to the right of trench 38 (such as source/body contact 116). Note that gate oxide 84 runs along either side of gate electrode 88.

Figure 21:
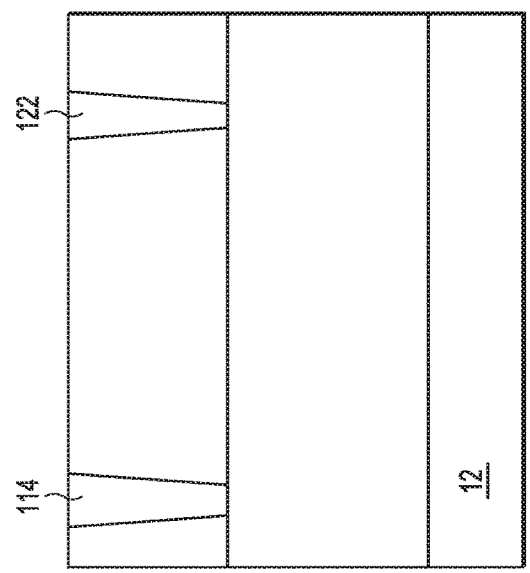
FIG. 21 illustrates a cross-section of the device of FIG. 16 at a fourth cut, in accordance with one embodiment of the present invention.

FIG. 21 illustrates a cross-section view of device 10 at the same stage in processing as FIG. 19 but taken through a fourth cut perpendicular to the first and third cuts and parallel to the second cut. As seen in FIG. 21, a contact spacing between source/body contacts, such as contacts 114 and 122, may be in a range of 0.3 to 10 microns, such as, for example, 0.45 microns.

Due to filling the trenches over the shield electrodes with an oxide to create oxide portions over the shield electrodes, such as oxide portions 68 and 70, a better quality IPD is achieved. Subsequent formation of openings within the oxide portions allows for the gate electrodes to be formed. This formation of the IPD with a deposited oxide followed by a CMP and subsequent formation of the gate electrodes helps prevent the formation of sharp corners in the bottom corners of the gate poly and in the top corners of the shield electrode. Note that in alternate embodiments, a different dielectric may be used in place of oxide portions 68 and 70 to achieve the improved IPDs. By reducing the formation of these sharp corners, leakage can be reduced and the breakdown of the IPD can be increased, resulting in improved performance and long-term reliability of the superjunction power device.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, any number of trenches may be formed for the superjunction power semiconductor device with each trench having a shield electrode and gate electrode. Also, different semiconductor materials may be used for the shield electrode or the gate electrode other than polysilicon. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a method for manufacturing a super junction power MOSFET includes forming a first trench in a semiconductor substrate; forming a first oxide layer over the semiconductor substrate and in the first trench, wherein the first oxide layer is along a bottom and sidewalls of the first trench; depositing electrically conductive material in the first trench to form a first shield electrode; masking a first portion of the electrically conductive material in the first trench; forming a recessed portion of the electrically conductive material by removing a part of a second portion of the electrically conductive material while the first portion of the electrically conductive material is masked; forming an oxide portion over and in contact with the recessed portion of the electrically conductive material; removing a part of the oxide portion in the first trench; removing the first oxide layer on the sidewalls of the trench while another part of the oxide portion remains in contact with the recessed portion of the electrically conductive material; forming a gate dielectric along exposed sidewalls of the first trench; and depositing additional electrically conductive material over the other part of the oxide portion in the first trench. In one aspect of this embodiment the method further includes forming a second trench in the semiconductor substrate; forming the first oxide layer along a bottom and sidewalls of the second trench; depositing the electrically conductive material in the second trench to form a second shield electrode; and masking the second shield electrode while forming the recessed portion of the electrically conductive material in the first trench. In another aspect, the method further includes forming a hard mask layer over the semiconductor substrate before forming the first trench, wherein forming the first trench removes a portion of the hard mask layer over the first trench. In a further aspect, the first oxide layer is blanket deposited over the hard mask and along the bottom and sidewalls of the first trench. In another further aspect, the electrically conductive material in the first trench is polysilicon. In another further aspect, the method further includes performing chemical-mechanical polishing to remove material extending above a nitride layer in the hard mask before the masking the first portion of the electrically conductive material in the first trench. In another aspect, the removing a part of a second portion of the electrically conductive material includes removing 30 to 50 percent of the electrically conductive material in the second portion. In another aspect, the method further includes performing chemical-mechanical polishing to remove material extending above the nitride layer after the forming an oxide portion over and in contact with the recessed portion of the electrically conductive material before removing the part of the oxide portion in the first trench. In another aspect, the removing the part of the oxide portion in the first trench includes masking the substrate with a second mask that includes an opening over the first trench that covers the gate dielectric and exposes a central portion of the oxide portion. In a further aspect, the removing the first oxide layer on the sidewalls of the trench includes isotropically etching the first oxide layer using the second mask.

In another embodiment, a method of making a semiconductor device includes forming a first mask over a semiconductor substrate, wherein the substrate includes a major surface covered with a nitride material, a first trench and a second trench in the major surface, the first and second trenches include a dielectric material along respective sidewalls and are filled with a first polysilicon material, and the first mask is configured to completely cover the first trench and only a portion of the second trench; removing a portion of the first polysilicon material from an unmasked portion of the second trench; removing the first mask; depositing a second dielectric material that fills the first and second trenches; forming a second mask over the nitride material on the substrate with an opening over the second trench, wherein the second mask overhangs a portion of the second dielectric material in the second trench; removing an unmasked portion of the second dielectric material in the second trench so that some of the second dielectric material remains over the first polysilicon material in the second trench and along the sidewalls of the second trench to form first and second shield electrodes; removing the second dielectric material along the sidewalls of the second trench while the some of the second dielectric material remains over the first polysilicon material in the second trench; removing the second mask; forming a third dielectric material along the sidewalls of the second trench; and filling the second trench with a second polysilicon material to form a first gate electrode. In one aspect of this another embodiment, the method further includes the forming the second mask includes the second mask being shaped to mask more of the second dielectric material along a length of the second trench than of a width of the second trench. In a further aspect, a length of 0.5 to 5 micrometers of the second dielectric material along the length of the second trench remains up to a top of the second trench after the second dielectric material along the sidewalls of the second trench is removed to form an inter-poly dielectric. In another aspect, the first mask is shaped so that a remaining portion of the first polysilicon material in the second trench extends up to a top of the second trench after the portion of the first polysilicon material from the unmasked portion of the second trench is removed. In another aspect, a thickness of 0.2 to 0.25 micrometers of the second dielectric material remains over the first polysilicon material in the second trench after the second dielectric material along the sidewalls of the second trench is removed. In yet another aspect, the method further includes removing the nitride material after the third dielectric is formed and the second trench is filled with the second polysilicon material. In a further aspect, the method further includes forming a doped implant region in a top portion of the semiconductor substrate between the first and second trenches; forming a fourth dielectric material over the substrate; and forming a contact in the fourth dielectric over and in contact with the first gate electrode. In yet another aspect, the method further includes forming a third shield electrode in a third trench in the major surface of the semiconductor substrate simultaneously with the first and second trenches, wherein the third shield electrode is formed on an opposite side of the second shield electrode from the first shield electrode, wherein the third trench includes the dielectric material along sidewalls of the third trench and is filled with the first polysilicon material, and the first mask is configured to completely cover only a portion of the third trench; removing a portion of the first polysilicon material from an unmasked portion of the third trench; depositing a second dielectric material that fills the third trench; the second mask overhangs a portion of the second dielectric material in the third trench; removing an unmasked portion of the second dielectric material in the third trench so that some of the second dielectric material remains over the first polysilicon material in the third trench and along the sidewalls of the third trench to form a third shield electrode. In a further aspect, the method further includes removing the second dielectric material along the sidewalls of the third trench while some of the second dielectric material remains over the first polysilicon material in the third trench; forming the third dielectric material along the sidewalls of the third trench; and filling the third trench with a second polysilicon material to form a second gate electrode. In yet a further aspect, the method further includes forming a doped implant region in a top portion of the semiconductor substrate between the second and third trenches; forming a second contact in the fourth dielectric over and in contact with the second gate electrode.

What is claimed is:

1. A method for manufacturing a super junction power MOSFET comprising:
   forming a first trench in a semiconductor substrate;
   forming a first oxide layer over the semiconductor substrate and in the first trench, wherein the first oxide layer is along a bottom and sidewalls of the first trench;
   depositing electrically conductive material in the first trench to form a first shield electrode;
   masking a first portion of the electrically conductive material in the first trench;
   forming a recessed portion of the electrically conductive material (44) by removing a part of a second portion of the electrically conductive material while the first portion of the electrically conductive material is masked;
   forming an oxide portion over and in contact with the recessed portion of the electrically conductive material;
   removing a part of the oxide portion in the first trench;
   removing the first oxide layer on the sidewalls of the trench while another part of the oxide portion remains in contact with the recessed portion of the electrically conductive material;
   forming a gate dielectric along exposed sidewalls of the first trench; and
   depositing additional electrically conductive material over the other part of the oxide portion in the first trench,
   wherein the removing the part of the oxide portion in the first trench includes masking the substrate with a second mask that includes an opening over the first trench that covers the gate dielectric and exposes a central portion of the oxide portion.

2. The method of claim 1 further comprising:
   forming a second trench in the semiconductor substrate;
   forming the first oxide layer along a bottom and sidewalls of the second trench;
      depositing the electrically conductive material in the second trench to form a second shield electrode; and
      masking the second shield electrode while forming the recessed portion of the electrically conductive material in the first trench.

3. The method of claim 1 further comprising:
   forming a hard mask layer over the semiconductor substrate before forming the first trench, wherein forming the first trench removes a portion of the hard mask layer over the first trench.

4. The method of claim 3 wherein:
   the first oxide layer is blanket deposited over the hard mask and along the bottom and sidewalls of the first trench.

5. The method of claim 2 wherein:
   the electrically conductive material in the first trench is polysilicon.

6. The method of claim 3 further comprising:
   performing chemical-mechanical polishing to remove material extending above a nitride layer in the hard mask before the masking the first portion of the electrically conductive material in the first trench.

7. The method of claim 1 wherein:
   the removing a part of a second portion of the electrically conductive material includes removing 30 to 50 percent of the electrically conductive material in the second portion.

8. The method of claim 1 further comprising:
   performing chemical-mechanical polishing to remove material extending above the nitride layer after the forming an oxide portion over and in contact with the recessed portion of the electrically conductive material before removing the part of the oxide portion in the first trench.

9. The method of claim 1 wherein:
   the removing the first oxide layer on the sidewalls of the trench includes isotropically etching the first oxide layer using the second mask.

10. A method of making a semiconductor device comprising:
    forming a first mask over a semiconductor substrate, wherein
       the substrate includes a major surface covered with a nitride material, a first trench and a second trench in the major surface, the first and second trenches include a dielectric material along respective sidewalls and are filled with a first polysilicon material, and
       the first mask is configured to completely cover the first trench and only a portion of the second trench;
    removing a portion of the first polysilicon material from an unmasked portion of the second trench;
    removing the first mask;

depositing a second dielectric material that fills the first and second trenches;

forming a second mask over the nitride material on the substrate with an opening over the second trench, wherein the second mask overhangs a portion of the second dielectric material in the second trench;

removing an unmasked portion of the second dielectric material in the second trench so that some of the second dielectric material remains over the first polysilicon material in the second trench and along the sidewalls of the second trench to form first and second shield electrodes;

removing the second dielectric material along the sidewalls of the second trench while the some of the second dielectric material remains over the first polysilicon material in the second trench;

removing the second mask;

forming a third dielectric material along the sidewalls of the second trench; and filling the second trench with a second polysilicon material to form a first gate electrode.

11. The method of claim 10 further comprising:

the forming the second mask includes the second mask being shaped to mask more of the second dielectric material along a length of the second trench than of a width of the second trench.

12. The method of claim 11 wherein a length of 0.5 to 5 micrometers of the second dielectric material along the length of the second trench remains up to a top of the second trench after the second dielectric material along the sidewalls of the second trench is removed to form an inter-poly dielectric.

13. The method of claim 10 wherein the first mask is shaped so that a remaining portion of the first polysilicon material in the second trench extends up to a top of the second trench after the portion of the first polysilicon material from the unmasked portion of the second trench is removed.

14. The method of claim 10 wherein a thickness of 0.2 to 0.25 micrometers of the second dielectric material remains over the first polysilicon material in the second trench after the second dielectric material along the sidewalls of the second trench is removed.

15. The method of claim 10 further comprising:

removing the nitride material after the third dielectric is formed and the second trench is filled with the second polysilicon material.

16. The method of claim 15 further comprising:

forming a doped implant region in a top portion of the semiconductor substrate between the first and second trenches;

forming a fourth dielectric material over the substrate; and forming a contact in the fourth dielectric over and in contact with the first gate electrode.

17. The method of claim 10 further comprising:

forming a third shield electrode in a third trench in the major surface of the semiconductor substrate simultaneously with the first and second trenches, wherein the third shield electrode is formed on an opposite side of the second shield electrode from the first shield electrode, wherein the third trench includes the dielectric material along sidewalls of the third trench and is filled with the first polysilicon material, and the first mask is configured to completely cover only a portion of the third trench;

removing a portion of the first polysilicon material from an unmasked portion of the third trench;

depositing a second dielectric material that fills the third trench;

the second mask overhangs a portion of the second dielectric material in the third trench;

removing an unmasked portion of the second dielectric material in the third trench so that some of the second dielectric material remains over the first polysilicon material in the third trench and along the sidewalls of the third trench to form a third shield electrode.

18. The method of claim 17 further comprising:

removing the second dielectric material along the sidewalls of the third trench while some of the second dielectric material remains over the first polysilicon material in the third trench;

forming the third dielectric material along the sidewalls of the third trench; and filling the third trench with a second polysilicon material to form a second gate electrode.

19. The method of claim 18 further comprising:

forming a doped implant region in a top portion of the semiconductor substrate between the second and third trenches;

forming a second contact in the fourth dielectric over and in contact with the second gate electrode.

\* \* \* \* \*